United States Patent
Hiltner

(10) Patent No.: US 8,471,746 B2
(45) Date of Patent: Jun. 25, 2013

(54) DIGITAL-TO-ANALOG CONVERSION WITH COMBINED PULSE MODULATORS

(75) Inventor: David F. Hiltner, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/179,320

(22) Filed: Jul. 8, 2011

(65) Prior Publication Data

US 2013/0009798 A1  Jan. 10, 2013

(51) Int. Cl.
*H03M 1/82* (2006.01)
(52) U.S. Cl.
USPC ............................. 341/152; 341/143; 341/155
(58) Field of Classification Search
USPC ............................. 341/52, 144, 143, 145, 152
See application file for complete search history.

(56) References Cited

U.S. PATENT DOCUMENTS

| | | | |
|---|---|---|---|
| 6,965,335 B1* | 11/2005 | Trotter et al. | 341/152 |
| 7,317,413 B2* | 1/2008 | Lee | 341/144 |
| 2003/0007570 A1* | 1/2003 | Kim et al. | 375/303 |
| 2004/0001011 A1* | 1/2004 | Komamura et al. | 341/52 |
| 2006/0290550 A1* | 12/2006 | Lee | 341/144 |
| 2010/0302085 A1* | 12/2010 | Chemisky et al. | 341/145 |

OTHER PUBLICATIONS

Combine two 8-bit outputs to make one 16-bit DAC, Steve Woodward, EDM, Sep. 30, 2004.
8-bit Atmel Microcontroller with 4/8/16K Bytes In-System Programmable Flash, May 2011.
"Faking" extra resolution with an 8 bit DAC—Phil Hobbs—Feb. 12, 2011.
Greater Resolution for the QED's 8-bit DAC—Mosaic Industries Application Note MI-AN-057, Jan. 1998.
Resistor/Pulse Width Modulation DAC, Edward Schlunder, Nov. 18, 2006.
The R/2nR DAC, http://www.allaboutcircuits.com/vol_4/chpt_13/2.html, Jun. 7, 2011.

* cited by examiner

*Primary Examiner* — Jean B Jeanglaude
(74) *Attorney, Agent, or Firm* — Marger Johnson & McCollom, P.C.; Thomas F. Lenihan

(57) ABSTRACT

A digital-to-analog converter includes first and second pulse modulators to generate first and second pulse modulated signals in response to first and second digital values, a third pulse modulator to generate a third pulse modulated signal in response to a third digital value, and a switch/filter circuit to generate an analog signal by combining the first and second pulse modulated signals in response to the third pulse modulated signal. The first and second pulse modulated signals may be low-pass filtered before being combined. In some embodiments, the third digital value may be incremented in a single direction between transitions of the first and second digital values. In some other embodiments, the third digital value may be incremented in opposite directions between alternating transitions of the first and second digital values.

23 Claims, 7 Drawing Sheets

| PWM1 | PWM2 | PWM3 |
|---|---|---|
| 0 | 1 | 0 |
| 0 | 1 | 1 |
| 0 | 1 | 2 |
| 0 | 1 | 3 |
| 1 | 2 | 0 |
| 1 | 2 | 1 |
| 1 | 2 | 2 |
| 1 | 2 | 3 |
| 2 | 3 | 0 |
| 2 | 3 | 1 |
| 2 | 3 | 2 |
| 2 | 3 | 3 |
| 3 | 4 | 0 |
| 3 | 4 | 1 |
| 3 | 4 | 2 |
| 3 | 4 | 3 |
| 4 | 5 | 0 |
| 4 | 5 | 1 |
| 4 | 5 | 2 |
| 4 | 5 | 3 |

FIG. 10

| PWM1 | PWM2 | PWM3 |
|---|---|---|
| 0 | 1 | 0 |
| 0 | 1 | 1 |
| 0 | 1 | 2 |
| 0 | 1 | 3 |
| 2 | 1 | 3 |
| 2 | 1 | 2 |
| 2 | 1 | 1 |
| 2 | 1 | 0 |
| 2 | 3 | 0 |
| 2 | 3 | 1 |
| 2 | 3 | 2 |
| 2 | 3 | 3 |
| 4 | 3 | 3 |
| 4 | 3 | 2 |
| 4 | 3 | 1 |
| 4 | 3 | 0 |
| 4 | 5 | 0 |
| 4 | 5 | 1 |
| 4 | 5 | 2 |
| 4 | 5 | 3 |

FIG. 11

| PWM1 | PWM2 | PWM3 |
|---|---|---|
| 0 | 1 | 0 |
| 0 | 1 | 1 |
| 0 | 1 | 2 |
| 0 | 1 | 3 |
| 2 | 1 | 2 |
| 2 | 1 | 1 |
| 2 | 1 | 0 |
| 2 | 3 | 0 |
| 2 | 3 | 1 |
| 2 | 3 | 2 |
| 2 | 3 | 3 |
| 4 | 3 | 2 |
| 4 | 3 | 1 |
| 4 | 3 | 0 |
| 4 | 5 | 0 |
| 4 | 5 | 1 |
| 4 | 5 | 2 |
| 4 | 5 | 3 |

FIG. 12

| PWM1 | PWM2 | PWM3 |
|---|---|---|
| 0 | 1 | 1 |
| 0 | 1 | 2 |
| 0 | 1 | 3 |
| 2 | 1 | 2 |
| 2 | 1 | 1 |
| 2 | 1 | 0 |
| 2 | 3 | 1 |
| 2 | 3 | 2 |
| 2 | 3 | 3 |
| 4 | 3 | 2 |
| 4 | 3 | 1 |
| 4 | 3 | 0 |
| 4 | 5 | 1 |
| 4 | 5 | 2 |
| 4 | 5 | 3 |

FIG. 13

DIGITAL-TO-ANALOG CONVERSION WITH COMBINED PULSE MODULATORS

BACKGROUND

A pulse width modulation (PWM) circuit can be used to perform as a digital-to-analog converter (DAC) by applying the PWM output signal to a low-pass filter having a corner frequency that is low enough to eliminate the high-frequency components of the PWM signal. PWM DAC circuits are especially useful for generating voltage references with microcontrollers because they can fairly easily generate linear analog outputs by applying appropriate low-pass filters to the PWM outputs that are available on many microcontrollers. These simplistic PWM DAC circuits, however, tend to be inaccurate and require difficult trade offs between resolution and response time. Obtaining higher resolution requires a longer PWM count chain which produces a lower fundamental frequency.

FIG. 1 illustrates a prior art PWM DAC circuit in which the outputs from two separate 8-bit PWMs 10 and 12 are combined through an analog summing/filter circuit 14 to provide a higher resolution DAC. Although this type of circuit may provide higher resolution, it may require highly accurate divider resistors and complex active circuitry to provide an accurate output. Additional problems may include the need to provide heavy filtering to extract the DC component from the PWM ripple which reduces the operating speed, and the need to compensate for internal component resistances in the active analog circuitry.

FIG. 2 illustrates another prior art PWM DAC circuit in which a PWM clock signal is used to dither between two adjacent output values of an 8-bit DAC. The DAC 16 outputs a value of N when the clock input is low and a value of N+1 when the clock input is high. Thus, by using a PWM signal as the clock input and filtering the DAC output with a low-pass filter 18, the circuit provides additional discrete analog output levels between the DAC output levels.

The technique illustrated in FIG. 2, however, reduces the operating speed substantially because the DAC output must be allowed to settle repeatedly at the different values of N and N+1 as the clock input transitions in response to the PWM input. Moreover, the circuit of FIG. 2 requires complex, dedicated and custom digital circuitry in the DAC to implement.

BRIEF DESCRIPTION OF THE DRAWINGS

FIGS. 10 and 11 show yet another way to illustrate the operation of the embodiment of FIG. 5 in the first and second modes of operation.

FIGS. 12 and 13 illustrate alternative embodiments of the second mode of operation for the embodiment of FIG. 5.

DETAILED DESCRIPTION

Figure 1:
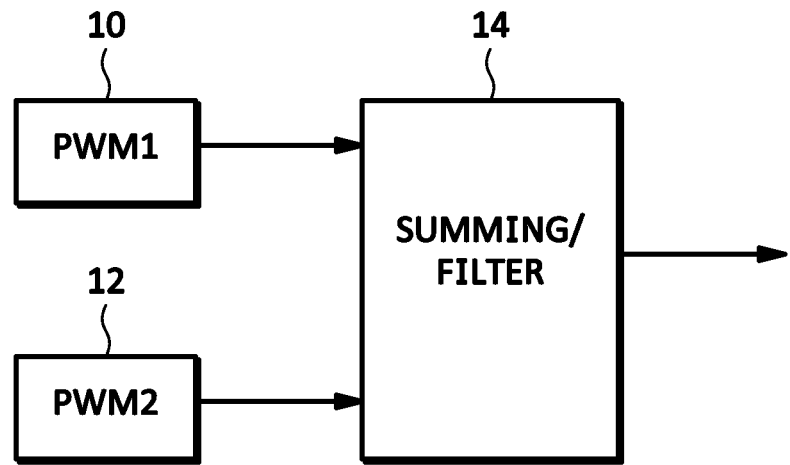
FIG. 1 illustrates a prior art PWM DAC circuit that combines outputs from two separate PWMs.
Figure 2:
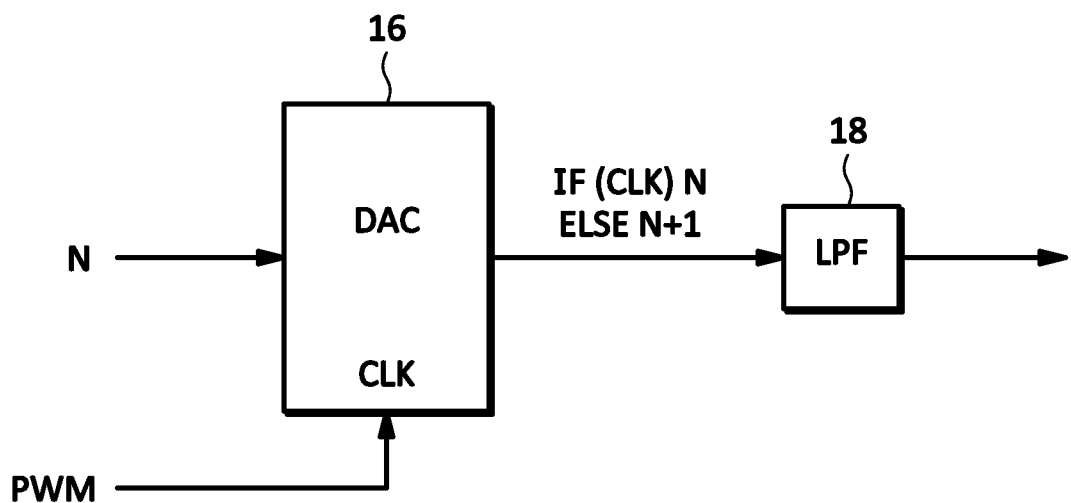
FIG. 2 illustrates another prior art PWM DAC circuit in which a PWM clock signal is used to dither between two adjacent output values of a DAC.
Figure 3:
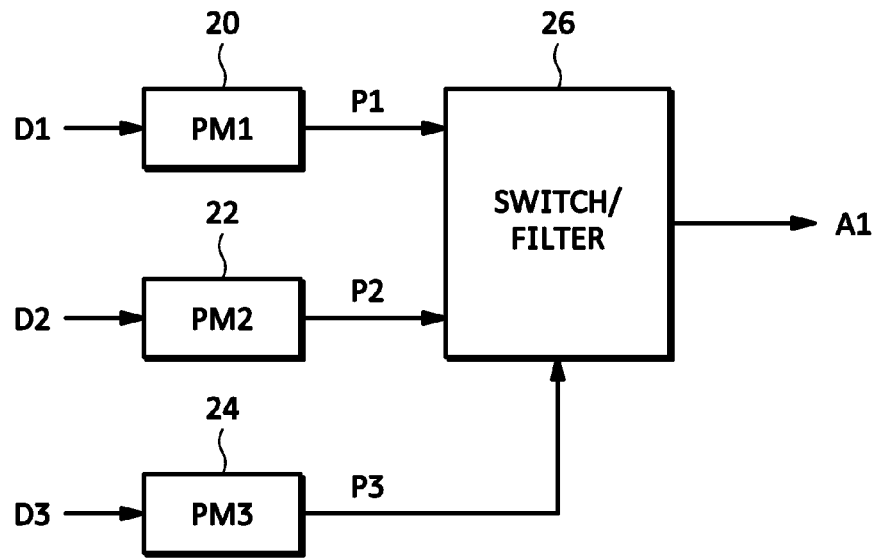
FIG. 3 illustrates an embodiment of a digital-to-analog converter in accordance with the subject invention.

FIG. 3 illustrates an embodiment of a digital-to-analog converter according to some inventive principles of this patent disclosure. The embodiment of FIG. 3 includes a first pulse modulator 20 to generate a first pulse modulated signal P1 in response to a first digital value D1, a second pulse modulator 22 to generate a second pulse modulated signal P2 in response to a second digital value D2, and a third pulse modulator 24 to generate a third pulse modulated signal P3 in response to a third digital value D3. A switch/filter circuit 26 generates an analog output signal A1 by combining the first and second pulse modulated signals P1 and P2 in response to the third pulse modulated signal P3 as described in more detail below.

The pulse modulators 20, 22 and 24 may implement any suitable modulation technique such as pulse width modulation (PWM), pulse frequency modulation (PFM), etc., or any combination of techniques, at any desired resolution, i.e., 8-bit, 10-bit, etc. The switch/filter circuit 26 may include any suitable combination of analog and/or digital switches, multiplexers, active and/or passive filters, etc.

Figure 4:
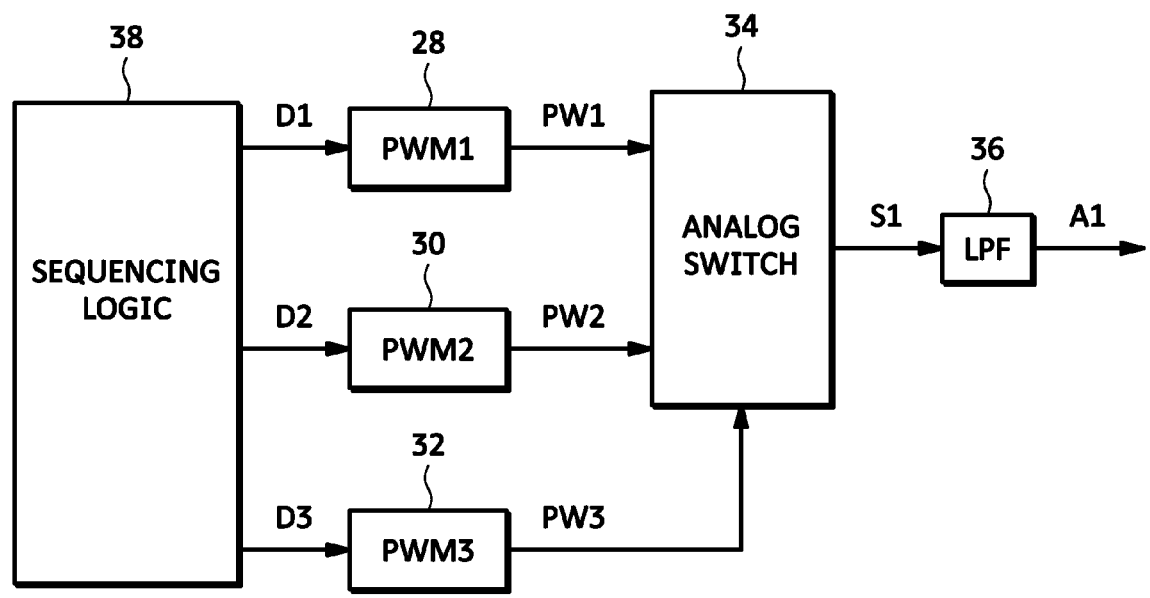
FIG. 4 is a block diagram of another exemplary embodiment of a digital-to-analog converter in accordance with the subject invention.

FIG. 4 is a block diagram of a first exemplary embodiment of a digital-to-analog converter illustrating some possible implementation details according to some inventive principles of this patent disclosure. In the embodiment of FIG. 4, the pulse modulators are realized as pulse width modulators (PWMs) 28, 30 and 32 (PWM1, PWM2, PWM3) which generate pulse width modulated signals PW1, PW2 and PW3 in response to digital values D1, D2 and D3, respectively. The switch/filter circuit is implemented with an analog or digital switch 34 which selectively couples the first and second pulse modulated signals PW1 and PW2 in a time-multiplexed manner to a low pass filter 36 in response to the third pulse width modulated signal PW3.

Sequencing logic 38 controls the overall operation of the converter by generating the digital values D1, D2 and D3 in an appropriate sequence to generate the desired analog output waveform. For example, the values of D1 and D2 may be selected as N and N+1, respectively, which bracket a desired output between N and N+1. The value of D3 may then be set to provide a duty factor DF between zero and one such that the value of the filtered analog output is N+DF.

Thus, the embodiment of FIG. 4 may generate a range of values between N and N+1, thereby providing greater resolution than would be available from either of the individual PWMs 28 and 30. The number of discrete steps between N and N+1 is determined by the resolution of PWM3. For example, if PWM3 is implemented with 8-bit resolution, there may be 256 steps between N and N+1. Thus, if all three PWMs are implemented with 8-bit resolution, the equivalent resolution of the resulting system may be as high as 16-bits depending on the implementation details such as the offset voltages of the low pass filter 36, analog switch 34, etc.

Moreover, the embodiment of FIG. 4 may provide faster operation than a single PWM DAC having the equivalent resolution because the sum of the settling time of PWM1 and PWM2, combined with the delay through the analog switch 34 and low pass filter 36 may be substantially less than the delay time of the count chain in the single PWM DAC.

The inventive principles are not limited to the details illustrated with respect to FIG. 4. For example, the resolutions of each of PWM1, PWM2 and PWM3 may be set to different values depending on the desired overall resolution, and the number of counts between PWM1 and PWM2 may be some number other than zero. The low pass filter may be implemented with active and/or passive circuitry, with any suitable number of poles, etc. Likewise, the sequencing logic be implemented with analog and/or digital hardware, software, firmware, etc., or any suitable combination thereof.

With the embodiment of FIG. 4, it may be beneficial to implement some or all of the PWMs with clock sources that are unsynchronized to prevent correlation between the PWMs from cancelling the respective contributions of the PWMs which may occur if the PWM signals are synchronous and have the same count length. This may prevent, for example, a situation in which PWM3 is not capable of passing pulses from PWM1 and PWM2 under circumstances in which the PWM modulus is identical for all three.

Figure 5:
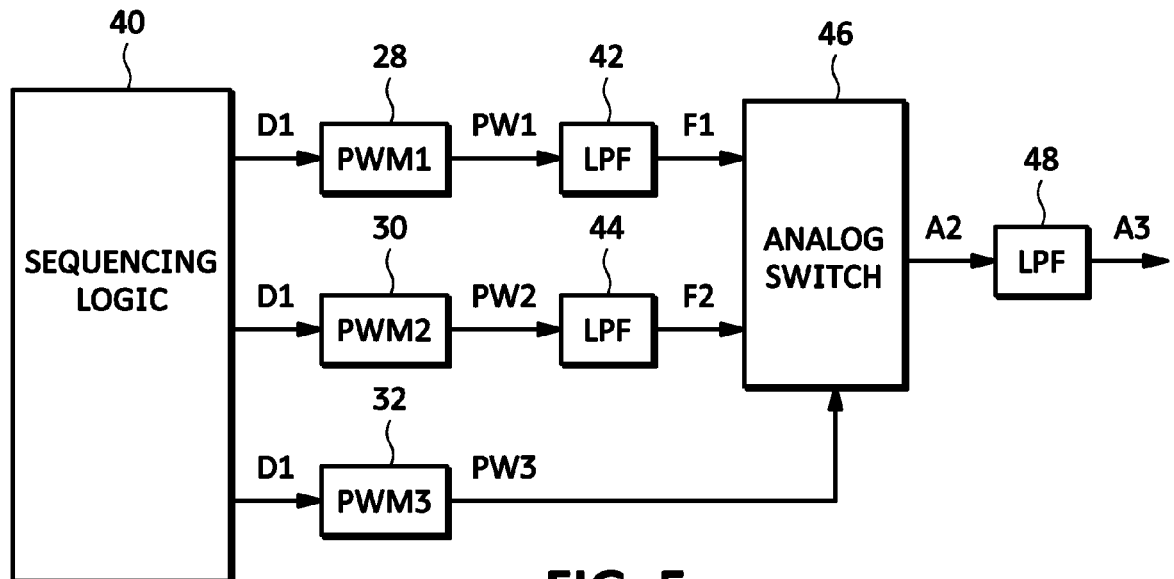
FIG. 5 is a block diagram of yet another embodiment of a digital-to-analog converter in accordance with the subject invention.

FIG. 5 is a block diagram of a second exemplary embodiment of a digital-to-analog converter illustrating some possible implementation details according to some inventive principles of this patent disclosure. In the embodiment of FIG. 5, the pulse modulators are again realized as pulse width modulators (PWMs) 28, 30 and 32 (PWM1, PWM2, PWM3) which generate pulse width modulated signals PW1, PW2 and PW3 in response to digital values D1, D2 and D3, respectively. However, the outputs of PWM1 and PWM2 are filtered before switching. A first low-pass filter 42 provides a first filtered signal F1 in response to the first pulse width modulated signal PW1, while a second low-pass filter 44 provides a second filtered signal F2 in response to the second pulse modulated signal PW2. An analog switch 46 is arranged to provide a multiplexed analog signal A2 by selecting the first and second filtered signals in response to the third pulse width modulated signal PW3. A third low-pass filter 48 removes the modulation ripple to provide the final analog output signal A3. Sequencing logic 40 controls the overall operation of the converter by generating the digital values D1, D2 and D3 in an appropriate sequence to generate the desired analog output waveform.

Some additional implementation details will be described in the context of the embodiment of FIG. 5, but the inventive principles are not limited to these details. Moreover, the embodiment of FIG. 5 may be operated in different modes by implementing different algorithms with the sequencing logic 40.

For purposes of illustration, and in a first mode of operation, PW1, PW2 and PW3 are each assumed to have 8-bit resolution. Sequencing logic 40 sets the digital values of D1 and D2 to generate the two filtered analog signals F1 and F2 with values of N and N+1, respectively, using PWM1 and PWM2 independently. The filters 42 and 44 may be implemented, for example, with two-pole active filters to remove virtually all of the induced ripple. The two filtered analog signals F1 and F2 are then modulated by analog switch 46 and filtered to produce the final analog output having a value N+DF where DF is the duty factor of the third pulse width modulated signal PW3. The third filter 48 may have a more gradual roll-off because the values of N and N+1 are relatively close.

To obtain an arbitrary 16-bit output voltage V, sequencing logic 40 may load PWM1 with a value D1 that provides a filtered analog signal F1=V/256, and load PWM2 with a value D2 that provides a filtered analog signal F2=1+V/256. PWM3 is then loaded with a value D3 that corresponds to V modulo 256.

Figure 6:
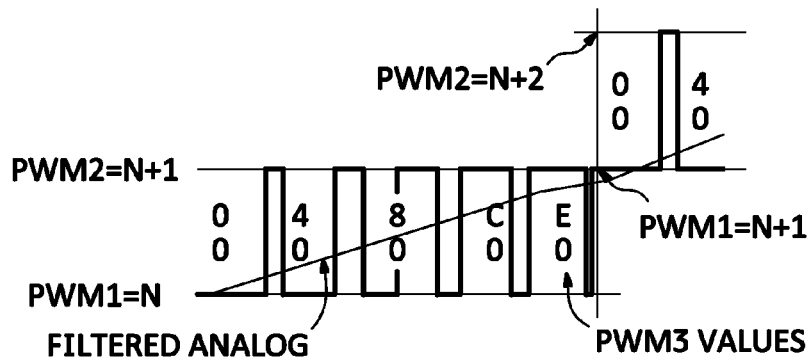
FIG. 6 illustrates the operation of the embodiment of FIG. 5 in the first mode of operation.

FIG. 6 illustrates the operation of the embodiment of FIG. 5 in the first mode of operation. Increasing values of the analog output voltage V are shown progressing from left to right. One portion of the full-scale range begins at the left side of FIG. 6 where PWM1=N, PWM2=N+1 and PWM3=0. Moving to the right, the filtered value of the final analog output signal increases as the value of PWM3 (shown in hexadecimal values) increases towards the maximum value FFh. For simplicity, only a few intermediate values of 40h, 80h, C0h and E0h are shown.

The system then enters a second portion of the full scale range as PWM3 is reset by transitioning from FFh back to 00h, PWM1 is incremented to N+1, and PWM2 is incremented to N+2. The value of PWM3 then increases again towards the maximum value FFh as the analog output voltage V continues to increase.

Figure 7:
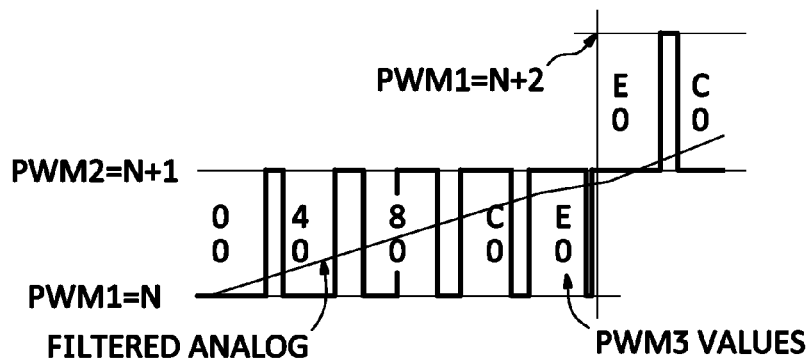
FIG. 7 illustrates the operation of the embodiment of FIG. 5 in a second mode of operation.

FIG. 7 illustrates the operation of the embodiment of FIG. 5 in a second mode of operation. Here, the first portion of the full-scale range again begins at the left side of FIG. 7 where PWM1=N, PWM2=N+1 and PWM3=0. Moving to the right, the filtered value of the final analog output signal increases as the value of PWM3 (shown in hexadecimal values) increases towards the maximum value FFh.

In the second mode, however, the value of PWM3 is not reset after reaching the maximum value FFh. Instead, in the second portion of the full-scale range, PWM3 is decremented (incremented in the opposite direction) back towards the minimum value of 00h. Also, rather than incrementing both of PWM1 and PWM2 as in the first mode, PWM2 remains at N+1 and PWM1 is double incremented to N+2. The analog output voltage V continues to increase as the value of PWM3 decreases.

The system reaches a third portion of the full-scale range (not shown) when PWM3 reaches 00h. At this transition, PWM1 remains at N+2, and PWM2 is double incremented to N+3. The filtered value of the final analog output signal then continues to increase as the value of PWM3 once again increases towards the maximum value FFh.

Thus, in the second mode of operation, the values of PWM1 and PWM2 are incremented in an alternating manner while the value of PWM3 is incremented in opposite directions between alternating transitions of PWM1 and PWM2.

A potential advantage of the second mode of operation is that it may provide monotonic operation even when the offsets of the first and second filters are controlled to a tolerance as loose as one 8-bit LSB. This is in contrast to the first mode of operation where the offsets may need to be as tight as one 16-bit LSB to provide monotonic operation. With the second mode, even a worst case in which the offset is only kept within 1/256 of full-scale amplitude, a sequence of 256 steps through one portion of the range would simply show no change in amplitude, but never reverse and become non-monotonic.

Figure 8:
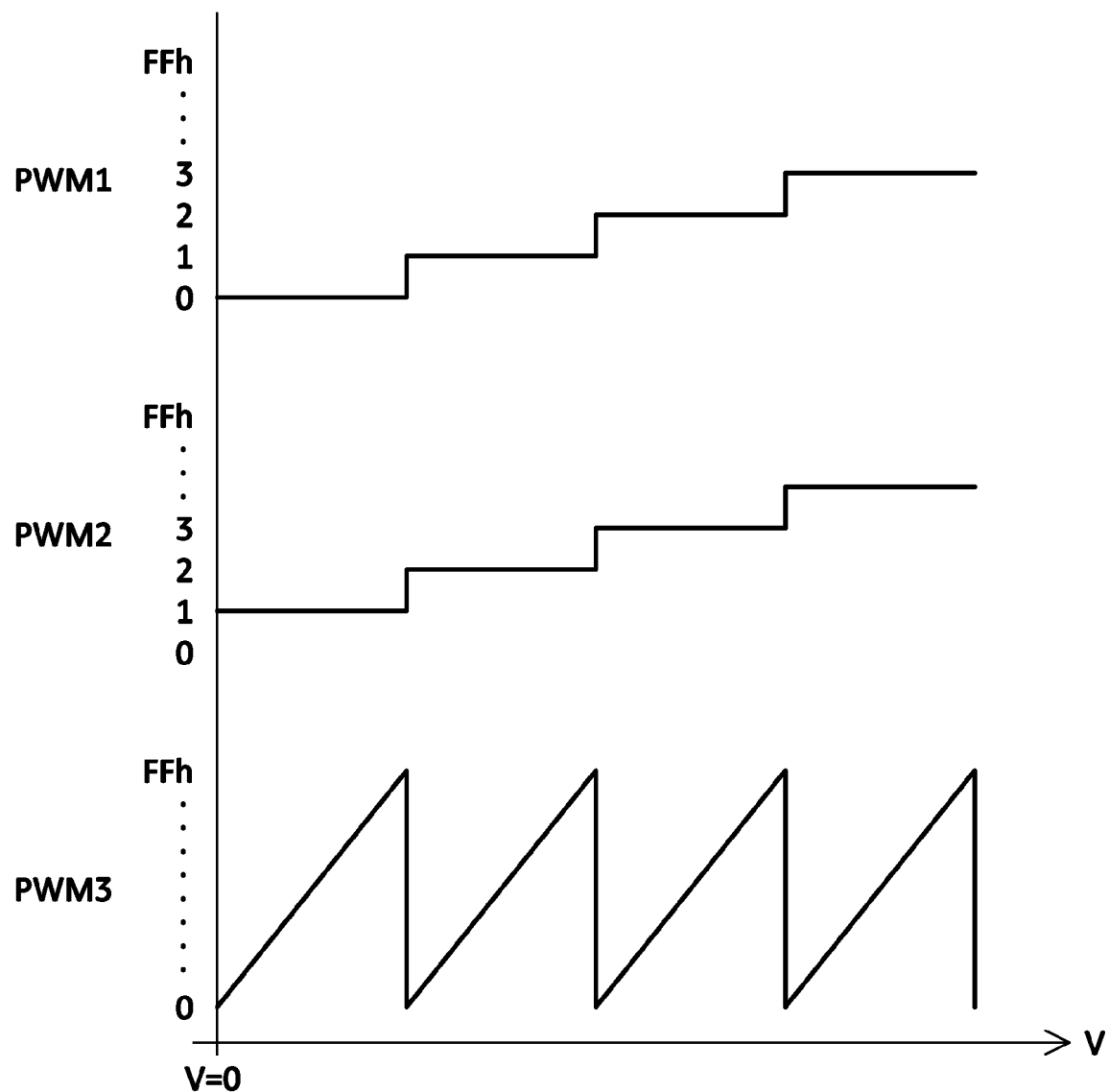
FIGS. 8 and 9 show another way to illustrate the operation of the embodiment of FIG. 5 in the first and second modes of operation.
Figure 9:
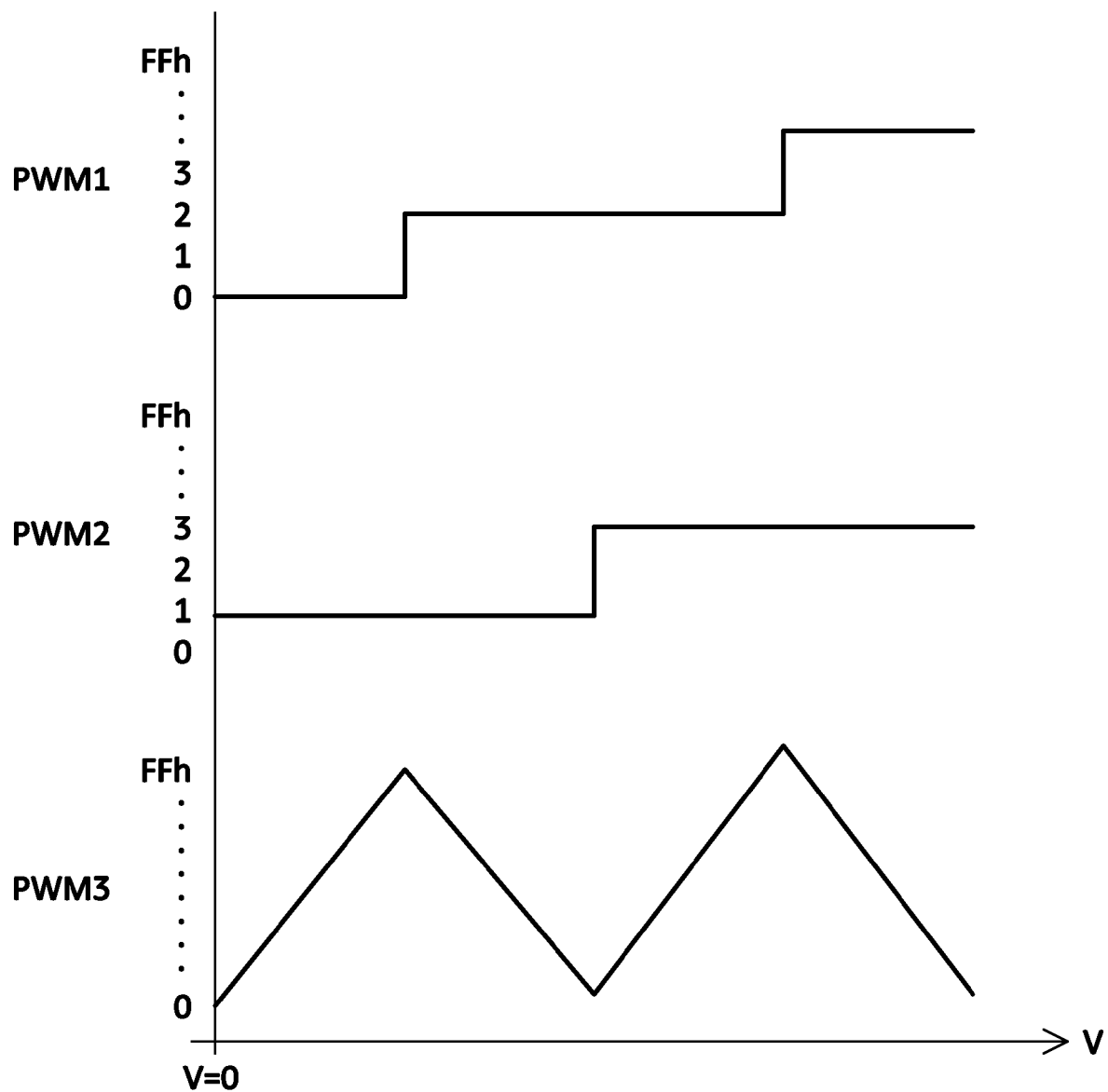

FIGS. 8 and 9 show another way to illustrate the operation of the embodiment of FIG. 5 in the first and second modes of operation, respectively.

Referring to FIG. 8, at V=0 in the first mode of operation, PWM1 is set to 0 and PWM2 is set to 1. PWM3 begins at zero, then increments to FFh as the analog output voltage V continues to increase towards the right. After reaching FFh, PWM3 is then reset to 00h, and PWM1 and PWM2 are incremented to 1 and 2, respectively at the transition. PWM3 is again incremented towards FFh until the next transition where PWM1 and PWM2 are incremented again and PWM3 is reset. Thus, PWM3 may be described as having a single slope direction (or polarity) with respect to the digital value D3 that drives it.

Referring to FIG. 9, the operation in the second mode is the same as for the first mode during the first portion of the full scale range. However, at the first transition where PWM3 reaches FFh, PWM1 is double incremented, PWM2 is left unchanged, and PWM3 is not reset, but rather begins to decrement towards 00h. Thus, from FIG. 9 PWM3 may be described as having two slope directions (or polarities) with respect to the digital value D3 that drives it, and each of PWM1 and PWM2 are alternately held constant or double incremented when the slope of PWM3 changes direction.

FIGS. 10 and 11 show yet another way to illustrate the operation of the embodiment of FIG. 5 in the first and second modes of operation, respectively. In the embodiments of FIGS. 10 and 11, the third PWM is implemented as a 2-bit PWM to simplify the illustrations. The values of PWM1, PWM2 and PWM3 are shown for increasing values of the analog output voltage V moving toward the bottom of the tables.

Referring to the table of FIG. 10, which illustrates the first mode, V begins at zero at the top of the table where PWM1=1, PWM2=1 and PWM3=0. PWM3 is then incremented to 1, 2 and 3 as PWM1 and PWM2 remain constant. As PWM3 is reset to 0, PWM1 and PWM2 are incremented to 1 and 2, respectively. PWM3 is then incremented to 1, 2 and 3 again as PWM1 and PWM2 remain constant. This pattern continues through the rest of the full scale range with PWM1 and PWM2 being incremented simultaneously each time PWM3 is reset to 0 in the first mode of operation.

Referring to the table of FIG. 11, which illustrates the second mode, V begins at zero at the top of the table where PWM1=1, PWM2=1 and PWM3=0. PWM3 is then incremented to 1, 2 and 3 as PWM1 and PWM2 remain constant. At the next step, PWM1 is double incremented to 2, PWM2 remains constant at 1, and PWM3 remains at 3. PWM3 is then decremented in a downward slope to 2, 1 and 0 as PWM1 and PWM2 remain constant. This pattern continues through the rest of the full scale range with PWM1 and PWM2 being alternately double incremented each time PWM3 transitions from a positive to a negative slope.

FIG. 12 illustrates an alternative embodiment of the second mode, again with PWM3 implemented as a 2-bit PWM, in which one of the steps in each downward sloping portion is eliminated to prevent a situation in which there may be no change in the analog output voltage if PWM3 remains at 3 for two steps.

FIG. 13 illustrates another alternative embodiment of the second mode, again with PWM3 implemented as a 2-bit PWM, in which one of the steps in each downward and upward sloping portion is eliminated to prevent a situation in which there may be no change in the analog output voltage if PWM3 remains at 0 or 3 for two steps.

The various embodiments of FIGS. 10, 11, 12 and 13 may be useful, for example, to accommodate PWMs in which one or both of the minimum or maximum values of PWM3 provide either a constant output or a narrow spike that is one clock cycle long.

A potential advantage of the embodiment of FIG. 5, regardless of the mode of operation, is that it may not be affected by synchronization of the clocks for the various PWMs.

Any of the logic described above may be implemented as analog and/or digital hardware, software, firmware, etc., or any suitable combination thereof.

In any of the embodiments described above, the sequencing logic may be implemented with program code running on a processing core in a microcontroller on which PWM1, PWM2 and PWM3 reside. This may be particularly beneficial with currently available microcontrollers which may have six channels of 8-bit PWM outputs, and thus may provide two complete channels of 16-bit PWM DACs.

Some potential benefits of the inventive principles described herein include the ability to implement higher resolution DACs utilizing existing, low-cost, debugged circuitry commonly available in microcontrollers, while placing lower demands on the analog circuitry.

As used herein, the term increment may refer to incrementing a value in either the positive direction or the negative direction (decrementing).

The inventive principles of this patent disclosure have been described above with reference to some specific example embodiments, but these embodiments can be modified in arrangement and detail without departing from the inventive concepts. For example, the embodiment of FIG. 3 may be modified to include additional PWMs that the switch/filter circuit may switch between. Such changes and modifications are considered to fall within the scope of the claims following the Appendices.

The invention claimed is:

1. A digital-to-analog converter comprising:
   a first pulse modulator to generate a first pulse modulated signal in response to a first digital value;
   a second pulse modulator to generate a second pulse modulated signal in response to a second digital value;
   a third pulse modulator to generate a third pulse modulated signal in response to a third digital value; and
   a switch/filter circuit to generate an analog signal by combining the first and second pulse modulated signals in response to the third pulse modulated signal.

2. The digital-to-analog converter of claim 1 where the switch/filter circuit comprises:
   a filter; and
   a switch arranged to selectively couple the first and second pulse modulated signals to the filter in response to the third pulse modulated signal.

3. The digital-to-analog converter of claim 1 where the switch/filter circuit comprises:
   a first filter to provide a first filtered signal in response to the first pulse modulated signal;
   a second filter to provide a second filtered signal in response to the second pulse modulated signal; and
   a switch arranged to provide a multiplexed signal by selecting the first and second filtered signals in response to the third pulse modulated signal.

4. The digital-to-analog converter of claim 3 where the switch/filter circuit further comprises a third filter to filter the multiplexed signal.

5. The digital-to-analog converter of claim 3 where the first and second filters have offsets that are within a least significant bit of the third pulse modulated signal.

6. The digital-to-analog converter of claim 1 where the third pulse modulated signal comprises a pulse width modulated signal.

7. The digital-to-analog converter of claim 6 where the first and second modulated signals comprise pulse width modulated signals.

8. The digital-to-analog converter of claim 1 where the third pulse modulated signal has a single slope direction with respect to the third digital value.

9. The digital-to-analog converter of claim 8 where the first and second pulse modulated signals are both incremented when the third pulse modulated signal is reset.

10. The digital-to-analog converter of claim 1 where the third pulse modulated signal has two slope directions with respect to the third digital value.

11. The digital-to-analog converter of claim 10 where one of the first and second modulated signals is held constant when the slope of the third pulse modulated signal changes direction.

12. The digital-to-analog converter of claim 11 where the first and second modulated signals are alternately incremented by more than one step each time the slope of the third pulse modulated signal changes direction.

13. A method comprising:
generating a first pulse modulated signal in response to a first digital value;
generating a second pulse modulated signal in response to a second digital value;
generating a third pulse modulated signal in response to a third digital value;
generating an analog signal by combining the first and second pulse modulated signals in response to the third pulse modulated signal.

14. The method of claim 13 where combining the first and second pulse modulated signals comprises switching between the first and second pulse modulated signals.

15. The method of claim 13 further comprising filtering the first and second pulse modulated signals prior to combining the first and second pulse modulated signals.

16. The method of claim 13 where the second digital value is equal to the first digital value plus an increment.

17. The method of claim 16 where the third digital value is incremented in a single direction between transitions of the first and second digital values.

18. The method of claim 13 where the first and second digital values transition in an alternating manner.

19. The method of claim 18 where the third digital value is incremented in opposite directions between alternating transitions of the first and second digital values.

20. A digital-to-analog converter comprising:
a first pulse width modulator;
a first filter having in input coupled to an output of the first pulse width modulator;
a second pulse width modulator;
a second filter having an input coupled to an output of the second pulse width modulator;
a third pulse width modulator;
an analog switch having a first analog input coupled to an output of the first filter, a second analog input coupled to an output of the second filter, and a select input coupled to an output of the third pulse width modulator; and
a third filter having an input coupled to an analog output of the analog switch and an output to provide an analog output signal.

21. The digital-to-analog converter of claim 20 further comprising sequencing logic to generate first, second and third digital input values for the first, second and third pulse width modulators, respectively.

22. The digital-to-analog converter of claim 21 where the sequencing logic is adapted to generate the first digital value of N, generate the second digital value of N+1, and vary the third digital value in a first direction to generate increasing values of the analog output signal in a first portion of the full scale range of the digital-to-analog converter.

23. The digital-to-analog converter of claim 22 where the sequencing logic is adapted to generate the first digital value of N+2, generate the second digital value of N+1, and vary the third digital value in a second direction to generate increasing values of the analog output signal in a second portion of the full scale range of the digital-to-analog converter.

* * * * *